(12) United States Patent
Kang et al.

(10) Patent No.: US 8,144,535 B2
(45) Date of Patent: Mar. 27, 2012

(54) TEST CIRCUIT FOR MEASURING RESISTANCE DISTRIBUTION OF MEMORY CELLS AND SEMICONDUCTOR SYSTEM INCLUDING THE SAME

(75) Inventors: Sang Beom Kang, Hwasung-si (KR); Ho Jung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 12/588,192

(22) Filed: Oct. 7, 2009

(65) Prior Publication Data

US 2010/0085826 A1    Apr. 8, 2010

(30) Foreign Application Priority Data

Oct. 8, 2008    (KR) .......................... 10-2008-0098622

(51) Int. Cl.
*G11C 7/00*    (2006.01)

(52) U.S. Cl. .................... 365/201; 365/185.21; 365/207

(58) Field of Classification Search ............. 365/185.21, 365/201

See application file for complete search history.

(56) References Cited

U.S. PATENT DOCUMENTS

| 6,181,626 B1 * | 1/2001 | Brown ........................ 365/210.1 |
| 6,314,014 B1 | 11/2001 | Lowrey et al. |
| 6,954,392 B2 | 10/2005 | Baker |

FOREIGN PATENT DOCUMENTS

KR    10-2004-0060169    7/2004

* cited by examiner

*Primary Examiner* — Hoai V Ho
*Assistant Examiner* — Anthan Tran
(74) *Attorney, Agent, or Firm* — Harness, Dickey & Pierce, P.L.C.

(57) ABSTRACT

The test circuit for measuring a resistance distribution of memory cells includes a sensing circuit and a digital value generation circuit. The sensing circuit compares a reference voltage with a voltage of a sensing node receiving a voltage of a bit line connected with a resistive element and generates a sensing signal. The digital value generation circuit generates a digital value corresponding to a resistance-capacitance (RC) delay of the bit line in response to the sensing signal from the sensing circuit.

8 Claims, 6 Drawing Sheets

TEST CIRCUIT FOR MEASURING RESISTANCE DISTRIBUTION OF MEMORY CELLS AND SEMICONDUCTOR SYSTEM INCLUDING THE SAME

FOREIGN PRIORITY STATEMENT

This application claims priority under 35 U.S.C. §119 to Korean Patent Application No. 10-2008-0098622, filed on Oct. 8, 2008, in the Korean Intellectual Property Office (KIPO), the entire contents of which are incorporated herein by reference.

BACKGROUND

1. Field

The example embodiments relate to a semiconductor device, and more particularly, to a test circuit for accurately measuring a resistance distribution and a semiconductor system including the same.

2. Related Art

Portable terminals such as notebook computers, personal digital assistants (PDAs), portable multimedia players (PMPs), MP3 players, and digital still cameras have been rapidly developed toward ultra-compactness, high speed, and intelligence. In addition, as information environments change with the development of new technology such as ubiquitous computing, home networking, and mobile computing, demand for high-density (Gb) high-speed (ns) non-volatile memory with a large capacity is increasing.

Through the spread and unification of ultra-compact high speed portable terminals, high-performance storage media for the portable terminals is increasingly required. Due to this requirement, next-generation non-volatile memory technology is attracting attention.

Advantageous features such as high storage density, high speed, low production price, and low power consumption are required for next-generation storage media. Examples of non-volatile memory devices with these features are magnetic random access memory (MRAM), ferroelectric random access memory (FRAM), phase-change random access memory (PRAM), and resistive random access memory (RRAM).

As the capacity of a memory device increases, the number of memory cells connected to a single bit line increases. As the length of the bit line increases, the capacitance of the bit line also increases. Accordingly, the speed of an operation of reading data from the memory cells decreases. Even if memory cells store the same type of data therein, the amount of current flowing in the bit line is different during the read operation according to a position at which a selected memory cell is connected to the bit line. Therefore, it is desired to measure a resistance distribution of a plurality of memory cells included in a memory device and increase a yield by managing the resistance distribution.

SUMMARY

Some embodiments provide a test circuit for accurately measuring a resistance distribution with respect to a plurality of memory cells and a semiconductor system including the same.

According to some embodiments, there is provided a test circuit for testing a semiconductor device. The test circuit includes a sensing circuit and a digital value generation circuit. The sensing circuit generates a sensing signal based on a reference voltage and a voltage of a sensing node receiving a voltage of a bit line connected with a resistive element. The digital value generation circuit generates a digital value corresponding to a resistance-capacitance (RC) delay of the bit line in response to the sensing signal from the sensing circuit.

The sensing circuit may include a precharge circuit configured to precharge the voltage of the sensing node with a precharge voltage in response to a precharge signal and a sense amplifier configured to generate a sensing signal based on the reference voltage received through a first input terminal and the voltage of the sensing node received through a second input terminal. The digital value generation circuit may include a counter configured to output a count value and a storage circuit configured to receive and store the count value output from the counter when the sensing signal makes transition.

Alternatively, the digital value generation circuit may include a counter configured to output a count value, a switch configured to control transmission of the count value from the counter in response to the sensing signal, and a latch configured to latch the count value output from the switch. The counter may perform a counting operation and output the count value when a voltage of a word line connected with the resistive element transit to a low level.

According to other embodiments, there is provided a semiconductor system including a semiconductor device including a test circuit and a processor configured to control an operation of the semiconductor device. The test circuit includes a sensing circuit configured to generate a sensing signal based on a reference voltage and a voltage of a sensing node receiving a voltage of a bit line connected with a resistive element; and a digital value generation circuit configured to generate a digital value corresponding to a resistance-capacitance (RC) delay of the bit line in response to the sensing signal from the sensing circuit.

The sensing circuit may include a precharge circuit configured to precharge the voltage of the sensing node with a precharge voltage in response to a precharge signal; and a sense amplifier configured to generate a sensing value based on the reference voltage received through a first input terminal and the voltage of the sensing node received through a second input terminal.

The digital value generation circuit may include a counter configured to output a count value and a storage circuit configured to receive and store the count value output from the counter when the sensing signal makes transition.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

The above and other features and advantages of example embodiments will become more apparent by describing in detail the example embodiments with reference to the attached drawings in which.

DETAILED DESCRIPTION OF THE EMBODIMENTS

Figure 1:
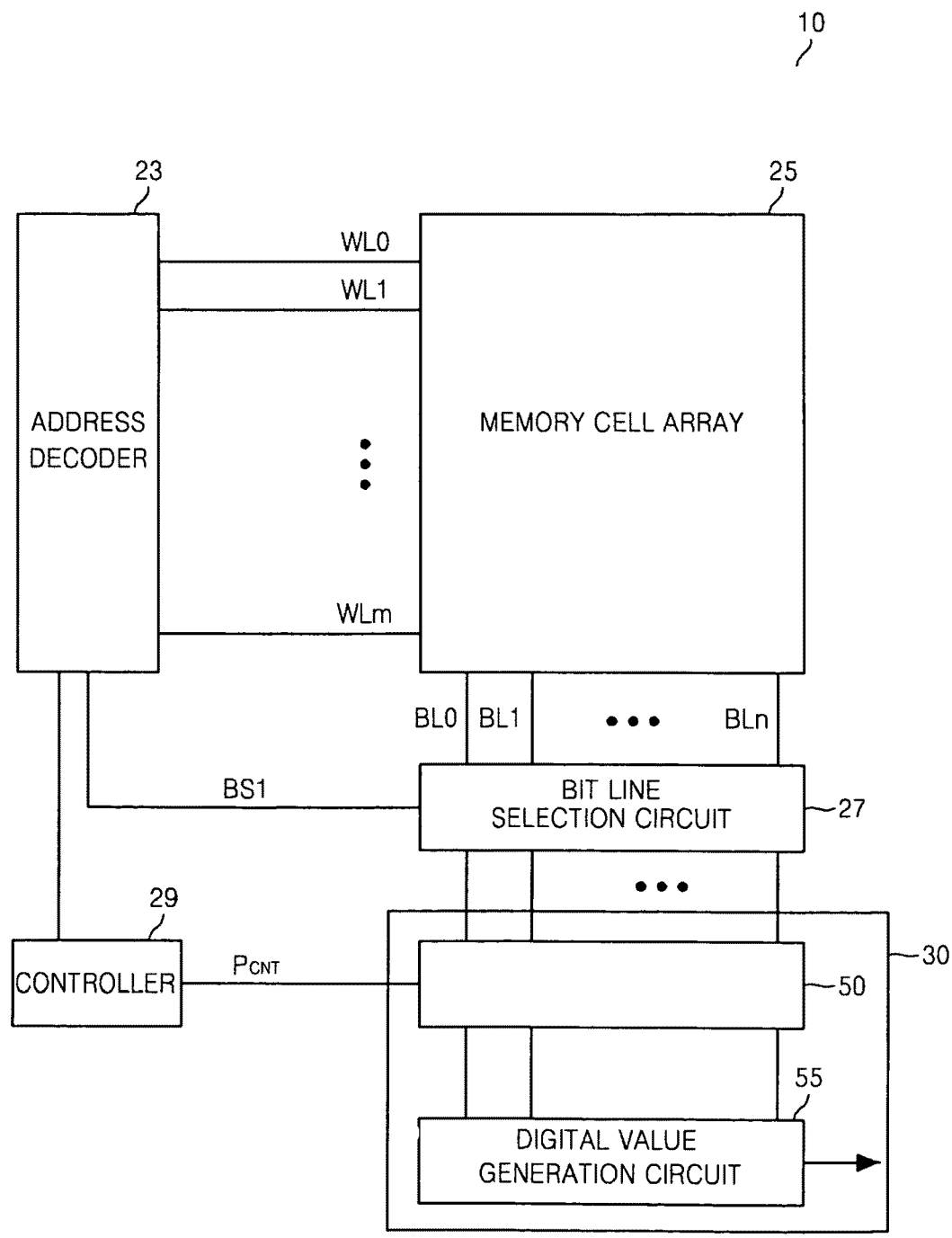
FIG. 1 is a schematic functional block diagram of a memory device including a test circuit according to some embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic functional block diagram of a memory device 10 including a test circuit 30 according to some embodiments. Referring to FIG. 1, the memory device 10 includes a memory cell array 25, an address decoder 23, a bit line selection circuit 27, a controller 29, and the test circuit 30. The memory device 10 may also include a clock signal generator (not shown), a reference voltage generator (not shown), an address buffer (not shown), and a column decoder (not shown).

The memory cell array 25 includes a plurality of bit lines BL0 through BLn, a plurality of word lines WL0 through WLm, and a plurality of memory cells.

A plurality of memory cells are connected in series to one of the bit lines BL0 through BLn to form a single string. The number (m+1) of memory cells (e.g., MC0 through MCm in FIG. 2) forming the single string may be 16, 32, or 64 according to a device, and the present embodiment is not restricted to the current embodiments. Here, the memory cells are resistive random access memory (RRAM) or phase-change random access memory (PRAM) cells including a resistive element.

The address decoder 23 is connected with the memory cell array 25 through the word lines WL0 through WLm and selects one from the word lines WL0 through WLm based on an externally input address signal. A bias voltage is applied to a plurality of memory cells connected to the selected word line. Also, the address decoder 23 generates a selection signal BS1 for selecting at least one bit line from the bit lines BL0 through BLn.

The bit line selection circuit 27 is connected with the memory cell array 25 through the bit lines BL0 through BLn and selects at least one bit line from the bit lines BL0 through BLn in response to the selection signal BS1 output from the address decoder 23.

Figure 2:
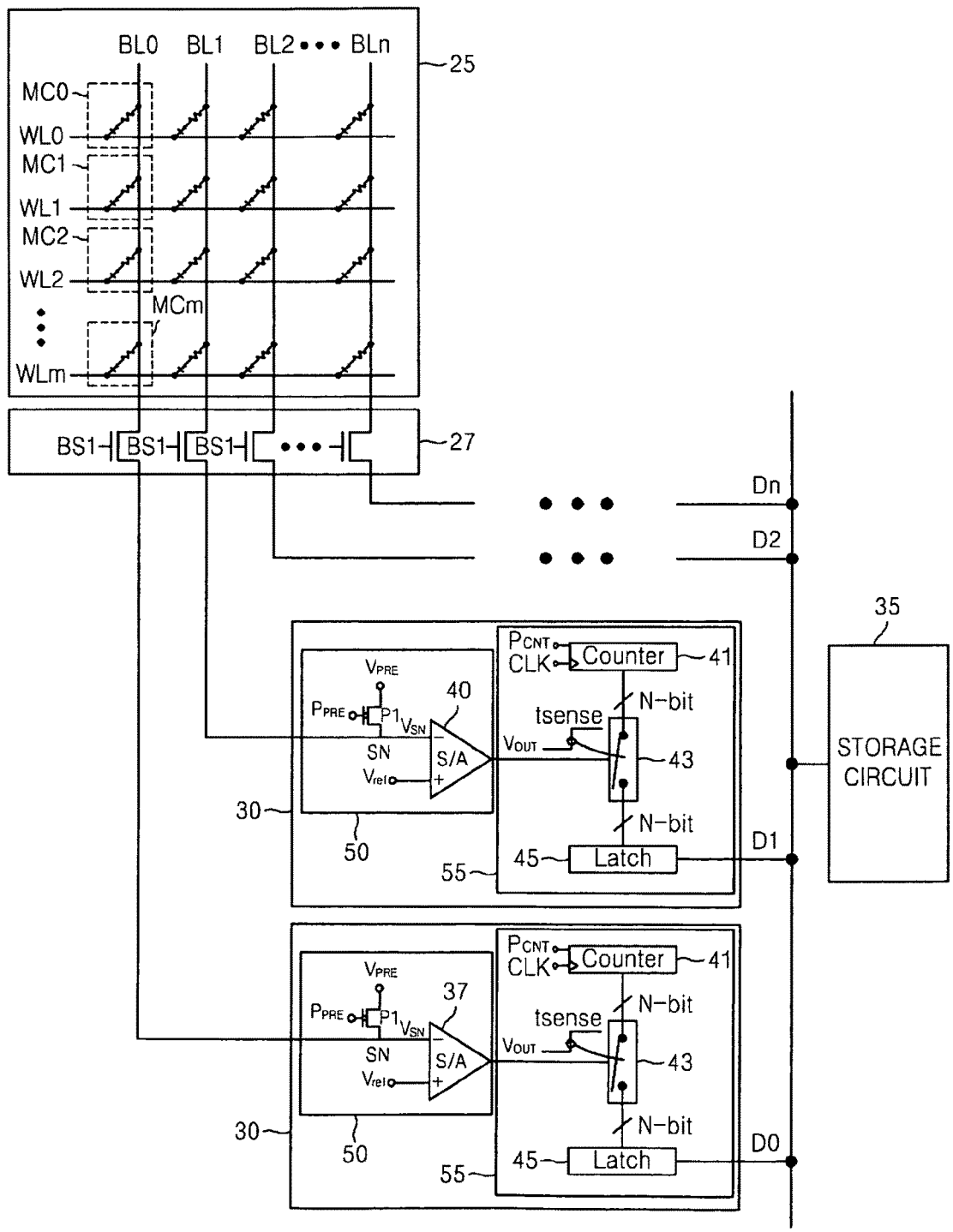
FIG. 2 is a schematic circuit diagram of a test circuit according to some embodiments.

The test circuit 30 is connected with the memory cell array 25 through the bit lines BL0 through BLn and includes a sensing circuit 50 and a digital value generation circuit 55. As illustrated in FIG. 2, the sensing circuit 50 compares a reference voltage $V_{ref}$ with a voltage $V_{SN}$ of a sensing node SN receiving a voltage of a bit line (e.g., BL0 or BL1) connected with a resistive element and generates a sensing signal $V_{OUT}$.

The digital value generation circuit 55 generates a digital value corresponding to a resistance-capacitance (RC) delay of the bit line (e.g., BL0 or BL1) in response to the sensing signal $V_{OUT}$ output from the sensing circuit 50. The structure and the operations of the test circuit 30 will be described in greater detail with reference to FIGS. 2 and 3.

The controller 29 controls the operations, e.g., a read operation and a write operation, of the memory device 10. In addition, the controller 29 generates a control signal $P_{CNT}$ for controlling the operations of the test circuit 30 during the read operation according to a signal of a word line selected by the address decoder 23.

For instance, the controller 29 may generate the control signal $P_{CNT}$ for controlling the operation of a counter 41 included in the digital value generation circuit 55 when the signal of the selected word line transits from a second logic level (e.g., a high level) to a first logic level (e.g., a low level). At this time, the control signal $P_{CNT}$ is an enable signal for controlling the counter 41 to perform counting after initialization.

The memory device 10 may be used as a main memory in a system such as a computer, a notebook computer, a personal digital assistant (PDA), a portable multimedia player (PMP), an MP3 player, a digital camera, a cellular telephone, or a portable terminal.

FIG. 2 is a schematic circuit diagram of test circuits 30 according to some embodiments. For clarity of the description, the memory cell array 25 and the bit line selection circuit 27 are also illustrated in FIG. 2. According to the current embodiments, the memory device 10 is implemented by resistive memory such as RRAM or PRAM, but the example embodiments are not restricted to the example illustrated in FIG. 2.

The memory cell array 25 includes a plurality of memory cells MC0 through MCm. Each of the memory cells MC0 through MCm may be structured or modeled with a single diode and a single resistive element which are connected in series to each other.

One end, i.e., the resistive element of each memory cell is connected to one of the bit lines BL0 through BLn and other ends, i.e., the cathodes of the diodes of a plurality of memory cells (e.g., MC0 through MCm) connected to the same bit line are connected to different word lines, respectively.

Such memory cell alternates between a high-resistance state (OFF) and a low-resistance state (ON) due to an applied voltage. Based on this feature, data stored in the memory cell can be identified as, for example, "reset data" or "set data".

In other words, during a write operation, the phase of the variable resistive element of the memory cell changes according to the level of current supplied to the memory cell and the period of time while the current is supplied. The memory cell stores "set data" corresponding to the low-resistance state or "reset data" corresponding to the high-resistance state. Here, the set data may be defined as data "0" and the reset data may be defined as data "1", or vice versa.

During a read operation, the memory cell has an RC delay according to the state, i.e., the resistance value of the resistive element, and data is identified using a time difference caused by the RC delay. In other words, the amount of current flowing in the memory cell or a voltage level of a bit line changes according to the resistance value, thereby changing a period of time taken to sense the data. Based on this fact, the memory device 10 can identify the data. At this time, the data stored in the memory cell corresponds to a period of time taken to sense the data with the RC delay.

The bit line selection circuit 27 includes a plurality of N-type metal-oxide semiconductor (NMOS) transistors, each of which may electrically connect one of the bit lines BL0 through BLn with one of the test circuits 30 in response to the selection signal BS1. In other words, the bit line selection circuit 27 is turned on in response to the selection signal BS1 to form a current path between a selected memory cell and one of the test circuits 30.

Referring to FIG. 2, the test circuits 30 are respectively connected to the bit lines BL0 through BLn. Each test circuit 30 includes the sensing circuit 50 which amplifies data read from each memory cell and the digital value generation circuit 55 which generates a digital value corresponding to the data.

The sensing circuit 50 includes a precharge circuit implemented by a P-type metal-oxide semiconductor (PMOS) transistor P1 and a sense amplifier 40. The PMOS transistor P1 is connected between a first node receiving a first voltage, e.g., a precharge voltage $V_{PRE}$, and a sensing node SN sensing the voltage of one of the bit lines BL0 through BLn connected with a resistive element. The PMOS transistor P1 precharges a voltage $V_{SN}$ of the sensing node SN with the precharge voltage $V_{PRE}$ in response to a precharge signal $P_{PRE}$.

The sense amplifier 40 includes a first (or positive (+)) input terminal receiving a reference voltage $V_{ref}$ output from a reference voltage generator (not shown), a second (or negative (−)) input terminal receiving the voltage $V_{SN}$ of the sensing node SN, and an output terminal. The sense amplifier 40 compares the voltage $V_{SN}$ of the sensing node SN with reference voltage $V_{ref}$, generates a sensing signal $V_{OUT}$ according to a comparison result, and outputs the sensing signal $V_{OUT}$ through the output terminal.

For instance, when the reference voltage $V_{ref}$ is lower than the voltage $V_{SN}$ of the sensing node SN, the sense amplifier 40 outputs the sensing signal $V_{OUT}$ at a first logic level (e.g., a low level). When the reference voltage $V_{ref}$ is higher than the voltage $V_{SN}$ of the sensing node SN, the sense amplifier 40 outputs the sensing signal $V_{OUT}$ at a second logic level (e.g., a high level).

The digital value generation circuit 55 includes a counter 41, a switch 43, and a latch 45. The counter 41 receives the control signal $P_{CNT}$ output from the controller 29 and a clock signal CLK output from a clock signal generator (not shown) and performs counting in response to the control signal $P_{CNT}$. The counter 41 counts the number of clock signals CLK until the logic of the sensing signal $V_{OUT}$ from the sense amplifier 40 makes transition and outputs a digital value (e.g., an N-bit digital value where N is a natural number) corresponding to a count value.

For instance, in response to the control signal $P_{CNT}$, the counter 41 initializes an N (e.g., N=4)-bit digital value to "0000" and outputs a digital count value sequentially increasing as each clock signal CLK is counted until the logic of the sensing signal $V_{OUT}$ makes transition.

The switch 43 is connected between the counter 41 and the latch 45. The switch 43 performs a switching operation in response to the level of the sensing signal $V_{OUT}$ from the sense amplifier 40 and controls the transmission of the count value, i.e., the digital value output from the counter 41 according to the switching operation. In other words, the switch 43 controls the connection between the counter 41 and the latch 45 according to the level of the sensing signal $V_{OUT}$.

The latch 45 receives the count value generated by the counter 41 via the switch 43 and latches the count value. The digital value generation circuit 55 may store the digital value latched by the latch 45 in a storage circuit 35.

The memory device 10 includes a plurality of the test circuits 30 respectively connected to the bit lines BL0 through BLn. The plurality of the test circuits 30 may share the single storage circuit 35. In other words, digital values respectively latched by latches 45 of the respective test circuits 30 may be sequentially output through a single bus and stored in the single storage circuit 35.

The storage circuit 35 may be implemented in at least a part of the inside or outside of the memory device 10. When the storage circuit 35 is implemented outside the memory device 10, the storage circuit 35 may be a memory of a portable terminal such as a cellular telephone, for example, a volatile memory such as random access memory (RAM). The present invention, however, is not restricted to the current embodiments.

In other embodiments, the digital value generation circuit 55 may include only the counter 41 and may be connected to the storage circuit 35. In this case, the counter 41 counts clock signals CLK and generates a count value in response to the control signal $P_{CNT}$. The storage circuit 35 receives a count value generated by the counter 41 when the sensing signal $V_{OUT}$ from the sense amplifier 40 makes transition and stores the count value in a digital format.

Figure 3:
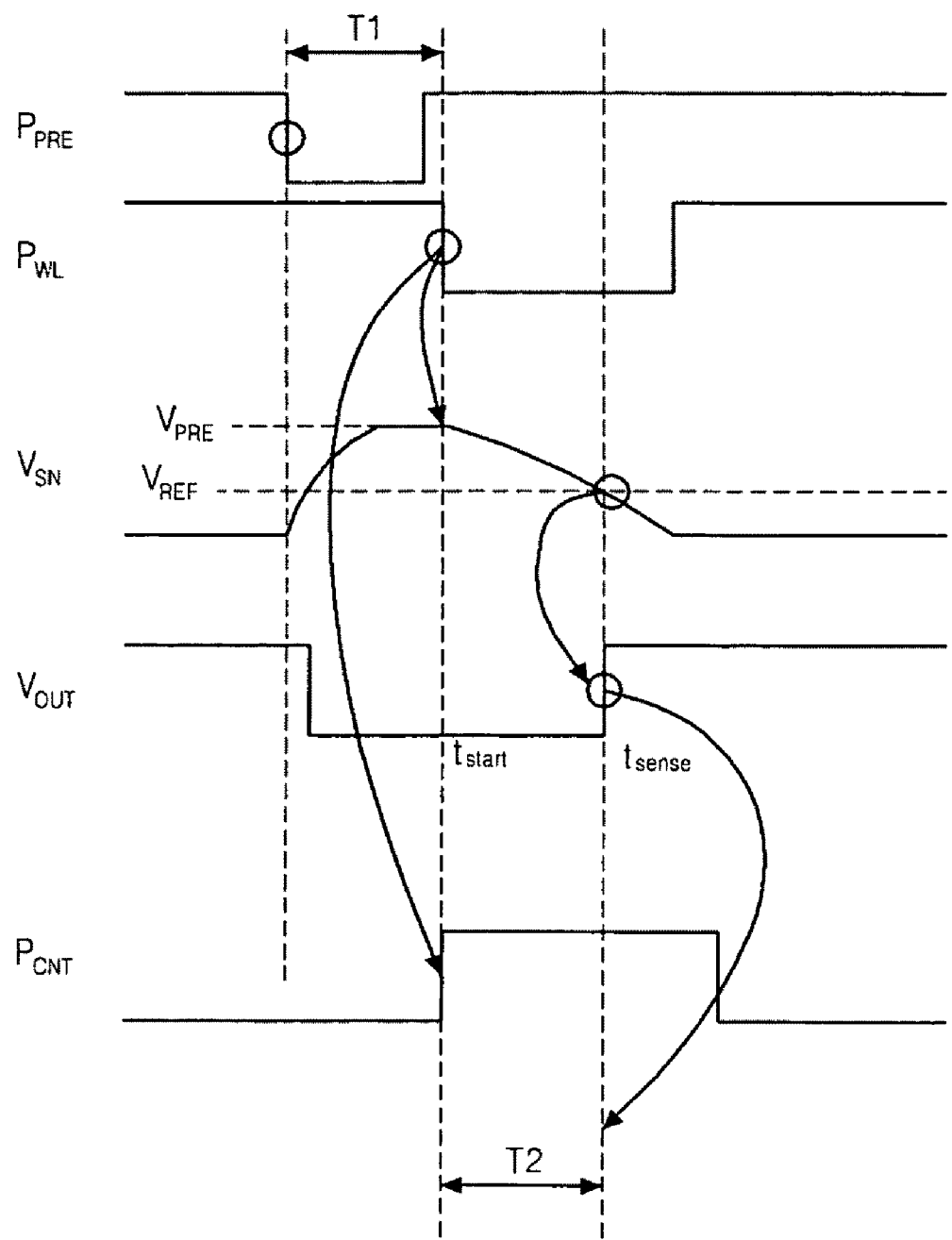
FIG. 3 is a timing chart for explaining a read operation of a memory device including a test circuit according to some embodiments.

FIG. 3 is a timing chart for explaining a read operation of a memory device including a test circuit according to some embodiments. Hereinafter, an operation of the test circuits 30 reading data from a memory cell and amplifying the data will be described with reference to FIGS. 2 and 3.

While the precharge signal $P_{PRE}$ is at a first logic level (e.g., a low level), that is, during a first period T1, the PMOS transistor P1 is turned on and supplies the precharge voltage $V_{PRE}$ to the sensing node SN. Accordingly, the voltage of a bit line connected with the sensing node SN is rapidly precharged up to the level of the precharge voltage $V_{PRE}$.

After the precharging is finished, when a word line $P_{WL}$ (e.g., WL0) transits to a first logic level (e.g., a low level) or a ground level at a time point $t_{start}$, a current path is formed between a selected memory cell and the sensing node SN, i.e., from the bit line (e.g., BL0) to the word line $P_{WL}$ and the bit line starts to be gradually discharged through a resistive element.

During the discharging, the sense amplifier 40 compares the voltage $V_{SN}$ of the sensing node SN with the reference voltage $V_{ref}$ and outputs the sensing signal $V_{OUT}$ according to a comparison result. For instance, the sense amplifier 40 outputs the sensing signal $V_{OUT}$ at a first logic level (e.g., a low level) when the voltage $V_{SN}$ of the sensing node SN is higher than the reference voltage $V_{ref}$ and outputs the sensing signal $V_{OUT}$ at a second logic level (e.g., a high level) when the voltage $V_{SN}$ of the sensing node SN is lower than the reference voltage $V_{ref}$.

At this time, a time point $t_{sense}$, at which the voltage of the bit line gradually decreasing reaches the level of the reference voltage $V_{ref}$ and the logic of the sensing signal $V_{OUT}$ makes transition, changes according to the resistance value of the resistive element. In other words, a period of time from the time point $t_{start}$ when the word line $P_{WL}$ transits to the first logic level (i.e., the low level) or the ground level to the time point $t_{sense}$ when the logic of the sensing signal $V_{OUT}$ makes transition, i.e., a second period T2 changes according to the data stored in the memory cell.

When the memory cell stores reset data, that is, when the resistive element has a high resistance value, the amount of current flowing in the memory cell is small, and therefore, a period of time taken for the voltage $V_{SN}$ of the sensing node SN to reach the level of the reference voltage $V_{ref}$, that is, a period of time (hereinafter, referred to as a "duration-by-high resistance") from the time point $t_{start}$ when the word line $P_{WL}$ transits to the first logic level (i.e., the low level) or the ground level to the time point $t_{sense}$ when the logic of the sensing signal $V_{OUT}$ makes transition, is long. In other words, discharging takes long when the data of the memory cell is sensed.

When the memory cell stores set data, that is, when the resistive element has a low resistance value, the amount of current flowing in the memory cell is large, and therefore, a period of time taken for the voltage $V_{SN}$ of the sensing node SN to reach the level of the reference voltage $V_{ref}$, that is, a period of time (hereinafter, referred to as a "duration-by-low resistance") from the time point $t_{start}$ when the word line $P_{WL}$ transits to the first logic level (i.e., the low level) or the ground level to the time point $t_{sense}$ when the logic of the sensing signal $V_{OUT}$ makes transition, is short. In other words, when the set data of the memory cell is sensed, discharging takes less time than it takes when the memory cell stores the reset data.

As described above, the memory device 10 can identify data stored in a memory cell by distinguishing the duration-by-low resistance from the duration-by-high resistance. In other words, the duration-by-low resistance corresponds to an RC delay of a bit line occurring when set data is sensed and the duration-by-high resistance corresponds to an RC delay of a bit line occurring when reset data is sensed.

However, even when a plurality of memory cells storing the same data are sensed, the duration-by-low resistance or the duration-by-high resistance may be different between the memory cells. Accordingly, accurately measuring a resistance distribution with respect to each memory cell is desired.

The controller 29 outputs the control signal $P_{CNT}$ when the second period T2 starts, that is, at the same time when the word line $P_{WL}$ transits to the first logic level (i.e., the low level) or the ground level.

The counter 41 performs initialization in response to the control signal $P_{CNT}$ output from the controller 29 and the counter 41 counts clock signals and generates a digital value according to a count result during the second period T2 from the time point $t_{start}$ when discharging starts to the time point $t_{sense}$ when the logic of the sensing signal $V_{OUT}$ makes transition.

In other words, the counter 41 is enabled in response to the control signal $P_{CNT}$ and counts clock signals during the second period T2, e.g., the duration-by-low resistance or the duration-by-high resistance, so that the counter 41 generates a digital value corresponding to the RC delay of the bit line.

The switch 43 is turned on in response to the sensing signal $V_{OUT}$ to connect the counter 41 with the latch 45, so that the counter 41 outputs a count value, i.e., the digital value to the latch 45. The latch 45 receives the digital value output from the counter 41 and stores it. When the test circuit 30 performs a sensing operation on data stored in another memory cell among the memory cells MC0 through MCm connected to the current bit line (e.g., BL0), the latch 45 outputs the stored digital value to the storage circuit 35 and then receives and stores a digital value for the another memory cell.

The storage circuit 35, as described above, sequentially receives and stores digital values for the respective memory cells MC0 through MCm and a processor (120 in FIG. 5) can accurately measure a resistance distribution based on the digital value of each memory cell stored in the storage circuit 35.

Figure 4A:
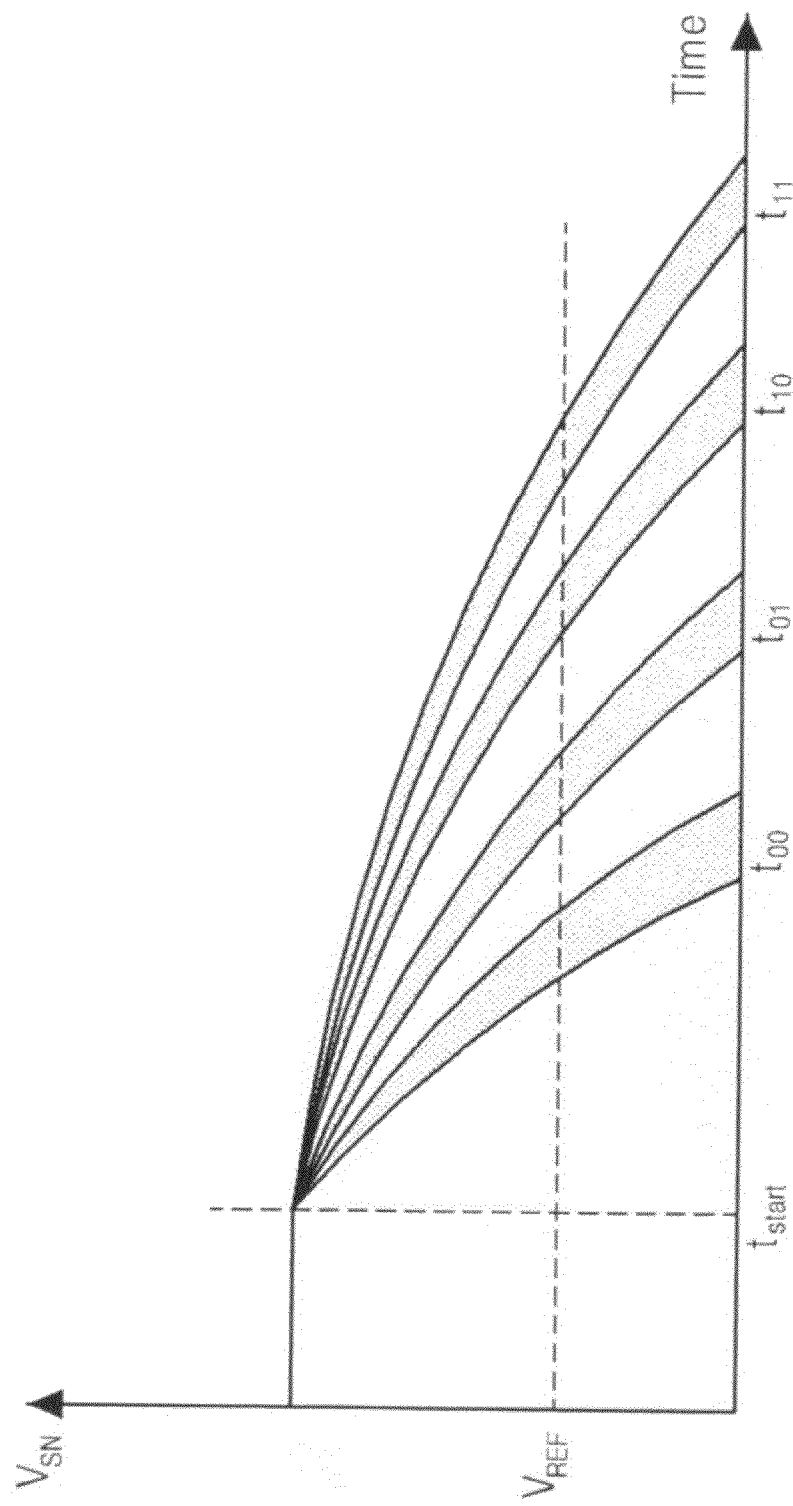
FIG. 4A is a graph showing time differences according to resistance-capacitance (RC) delays with respect to data stored in memory cells illustrated in FIG. 2.
Figure 4B:
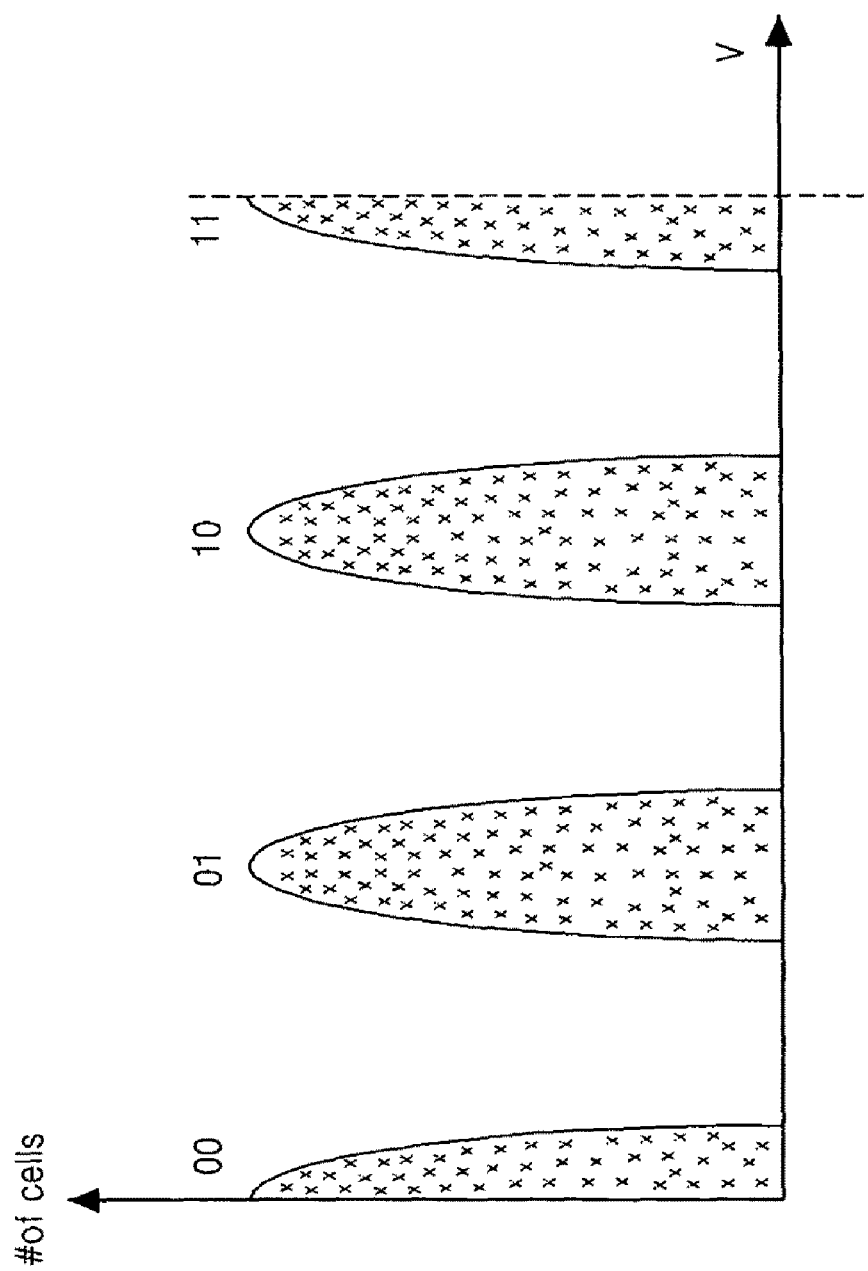
FIG. 4B is a graph showing the variations of threshold voltage in the memory cells illustrated in FIG. 2.

FIG. 4A is a graph showing time differences according to RC delays with respect to data stored in memory cells illustrated in FIG. 2. FIG. 4B is a graph showing the variations of threshold voltage in the memory cells illustrated in FIG. 2.

Referring to FIGS. 4A and 4B, the memory cells are multi-level memory cells which can store 2-bit data. In other words, the memory device 10 illustrated in FIGS. 1 and 2 may be implemented using multi-level memory cells which can store 2-bit data (i.e., "11", "10", "01", and "00").

The memory device 10 identifies data based on the fact that a difference in resistance value appears as a difference in the second period T2 from the time point $t_{start}$ when discharging starts to the time point $t_{sense}$ when the logic of the sensing signal $V_{OUT}$ makes transition.

Referring to FIG. 4A, the second period T2 increases as the resistance value of a memory cell increases. For instance, when the data stored in the memory cell is "00", the memory cell has the least resistance value, and therefore, the second period T2 is the shortest. When the data stored in the memory cell is "11", the memory cell has the greatest resistance value, and therefore, the second period T2 is the longest. As described above, when the resistance value of the memory cell increases, a period of time from the time point $t_{start}$ when the data stored in the memory cell starts to be read to the time point $t_{sense}$ when the logic of a comparison signal makes transition also increases. In addition, referring to FIG. 4B, the memory cells which can store the 2-bit data ("11", "10", "01", and "00") haves four variations of threshold voltage according to programming.

The memory device 10 may collect data from either all or a predetermined or reference number of the memory cells at the storage circuit 35 and calculate statistic data on the distributions of different resistance values among the memory cells. In other words, a resistance distribution may be calculated with respect to memory cells storing data "11", memory cells storing data "10", memory cells storing data "01", and memory cells storing data "00" at one time as illustrated in FIG. 4B.

In other words, the test circuit 30 measures the distribution of different resistance values according to data stored in each of a plurality of memory cells with respect to each memory cell, accumulatively stores the measured distribution of the resistance values, and calculates a resistance distribution with respect to all of the memory cells at one time. Accordingly, the test circuit 30 accurately measures the resistance distribution with respect to a plurality of memory cells and manages an error rate using the measured distribution, thereby increasing the yield of the memory device 10. In addition, through the accurate measurement of the resistance distribution with respect to the memory cells included in the memory device 10, the test circuit 30 increases the reliability of the memory device 10.

Figure 5:
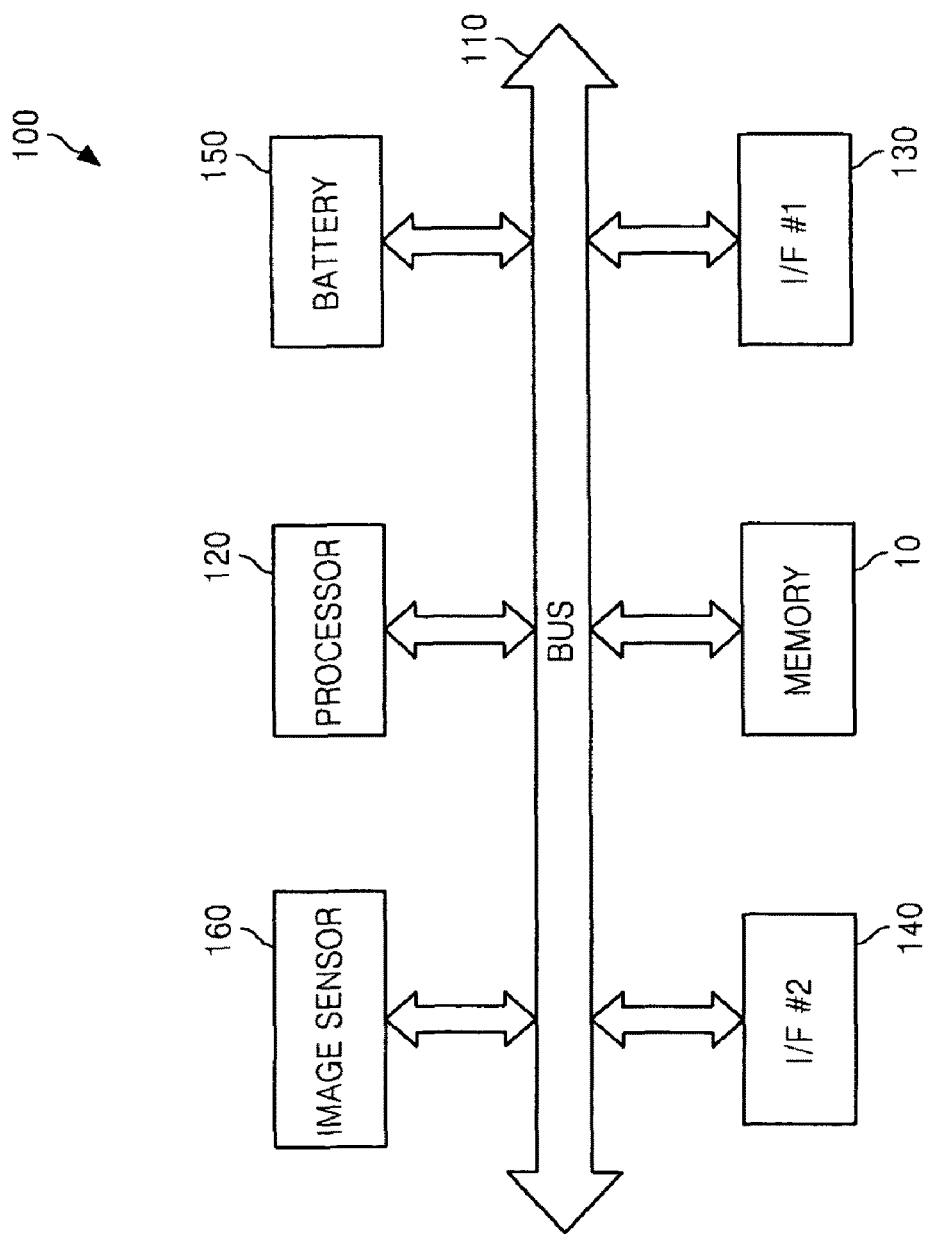
FIG. 5 is a schematic block diagram of a semiconductor system including a semiconductor device according to some embodiments.

FIG. 5 is a schematic block diagram of a semiconductor system 100 including a semiconductor device according to some embodiments. The semiconductor system 100 includes the semiconductor device, i.e., the memory device 10 and the processor 120, which are connected to a system bus 110.

The processor 120 controls the write, read or verify-read operation of the memory device 10 overall. For instance, the processor 120 outputs a command to control the write operation of the memory device 10 and write data. In addition, the processor 120 may generate a command to control the read or verify-read operation of the memory device 10. Accordingly, a control block (not shown) included in the semiconductor system 100 performs the verify-read operation or the program (or write) operation in response to a control signal output from the processor 120.

When the semiconductor system 100 is embodied as a portable application, the semiconductor system 100 may also include a battery 150 to supply operating power to the memory device 10 and the processor 120. The portable application may be, for example, a portable computer, a digital camera, a PDA, a cellular telephone, an MP3 player, a PMP, an automotive navigation system, a memory card, a smart card, a game machine, an electronic dictionary, or a solid state disc.

The semiconductor system 100 may also include an interface, e.g., an input/output unit, 130 to communicate data with an external data processing device. When the semiconductor system 100 is a wireless system, the semiconductor system 100 may also include a wireless interface 140 which may be connected to the processor 120 and communicate data with an external wireless device (not shown) through the system bus 110 via a wireless connection. For instance, the processor 120 may process data input through the wireless interface 140 and stores the data in the memory device 10 and may also read data from the memory device 10 and transmit the data to the wireless interface 140.

When the memory device 10 is used as a main memory in a computer, the processor 120 may control the input/output of a digital value stored in the storage circuit 35 included in the memory device 10 and control the overall operation of the semiconductor system 100. The processor 120 calculates the number of digital values stored in the storage circuit 35, compares the number of digital values with a minimum distribution value, and determines, based on a result of the comparison, whether the data on memory cells collected at the storage circuit 35 is sufficient to measure a resistance distribution.

For instance, when the number of digital values is greater than the minimum distribution value, the processor 120 may determine that sufficient data on memory cells has been collected at the storage circuit 35 and control the storage circuit 35 to output the digital values stored in the storage circuit 35 according to a determination result. As the number of digital values for respective memory cells stored in the storage circuit 35 increases, the more accurate the resistance distribution becomes.

When the number of digital values is less than the minimum distribution value or another reference value selected according to operational needs, the processor 120 may determine that data on memory cells collected at the storage circuit is not sufficient to accurately measure a resistance distribution and delay the output of the digital values stored in the storage circuit 35 until sufficient data on memory cells is collected at the storage circuit according to a determination result.

The minimum distribution value is a reference value to measure an accurate resistance distribution with respect to a plurality of memory cells included in the memory device 10. The minimum distribution value may vary with a type of the memory device 10 (e.g., PRAM or RRAM) and a type of the semiconductor system 100 including the memory device 10.

The wireless system may be a wireless device such as, for example, a PDA, a portable computer, a wireless telephone, a pager, or a digital camera; a radio frequency identification (RFID) reader; or an RFID system. The wireless system may also a wireless local area network (WLAN) system or a wireless personal area network (WPAN) system. Moreover, the wireless system may be a cellular network.

When the semiconductor system 100 is an image pick-up device, the semiconductor system 100 may also include an image sensor 160 converting an optical signal into an electrical signal. The image sensor 160 may be, for example, an image sensor using a charge coupled device (CCD) or a complementary metal-oxide semiconductor (CMOS) image sensor manufactured using a CMOS process. At this time, the semiconductor system 100 may be a digital camera, a cellular telephone equipped with a digital camera, or a satellite system equipped with a camera.

A test circuit according to some embodiments and a semiconductor system including the same accurately measure a resistance distribution with respect to a plurality of memory cells and manage an error rate using the accurately measured resistance distribution, thereby increasing the yield of memory devices. In addition, through the accurate measurement of the resistance distribution with respect to a plurality of memory cells included in a memory device, the reliability of a semiconductor device including the memory device can be increased.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A test circuit for testing a semiconductor device, the test circuit comprising:
   a sensing circuit configured to generate a sensing signal based on a reference voltage and a voltage of a sensing node receiving a voltage of a bit line connected with a resistive element; and
   a digital value generation circuit configured to generate a digital value corresponding to a resistance-capacitance (RC) delay of the bit line in response to the sensing signal from the sensing circuit, wherein the digital value generation circuit includes,
   a counter configured to output a count value; and
   a storage circuit configured to receive and store the count value output from the counter as the digital value when the sensing signal changes level.

2. The test circuit of claim 1, wherein the sensing circuit comprises:
   a precharge circuit configured to precharge the voltage of the sensing node with a precharge voltage in response to a precharge signal; and
   a sense amplifier configured to generate the sensing signal based on the reference voltage and the voltage of the sensing node.

3. The test circuit of claim 1, wherein the counter is configured to performs a counting operation and output the count value when a voltage of a word line connected with the resistive element changes to a low level.

4. A test circuit for testing a semiconductor device, the test circuit comprising:
   a sensing circuit configured to generate a sensing signal based on a reference voltage and a voltage of a sensing node receiving a voltage of a bit line connected with a resistive element; and
   a digital value generation circuit configured to generate a digital value corresponding to a resistance-capacitance (RC) delay of the bit line in response to the sensing signal from the sensing circuit, wherein the digital value generation circuit includes,
   a counter configured to output a count value;
   a switch configured to control transmission of the count value from the counter in response to the sensing signal; and
   a latch configured to latch the count value output from the switch as the digital value.

5. The test circuit of claim 4, wherein the counter is configured to perform a counting operation and outputs the count value when a voltage of a word line connected with the resistive element changes to a low level.

6. A semiconductor system comprising:
   a semiconductor device having a test circuit; and
   a processor configured to control an operation of the semiconductor device,
   wherein the test circuit includes,
   a sensing circuit configured to generate a sensing signal based on a reference voltage and a voltage of a sensing node receiving a voltage of a bit line connected with a resistive element; and
   a digital value generation circuit configured to generate a digital value corresponding to a resistance-capacitance (RC) delay of the bit line in response to the sensing signal from the sensing circuit, wherein the digital value generation circuit includes,
   a counter configured to output a count value; and
   a storage circuit configured to receive and store the count value output from the counter as the digital value when the sensing signal changes level.

7. The semiconductor system of claim 6, wherein the sensing circuit comprises:
   a precharge circuit configured to precharge the voltage of the sensing node with a precharge voltage in response to a precharge signal; and
   a sense amplifier configured to generate the sensing signal based on the reference voltage received through a first input terminal and the voltage of the sensing node received through a second input terminal.

8. The semiconductor system of claim 6, wherein the counter is configured to perform a counting operation and output the count value when a voltage of a word line connected with the resistive element changes to a low level.

* * * * *